(12) United States Patent
Qin et al.

(10) Patent No.: US 11,519,754 B2
(45) Date of Patent: Dec. 6, 2022

(54) ISOLATION AMPLIFIER WITH REFERENCE SIGNAL TRANSFER

(71) Applicant: Analog Devices International Unlimited Company, Limerick (IE)

(72) Inventors: Wenhui Qin, Shanghai (CN); Shaoyu Ma, Shanghai (CN); Tianting Zhao, Beijing (CN); Fang Liu, Beijing (CN)

(73) Assignee: Analog Devices International Unlimited Company, Limerick (IE)

( * ) Notice: Subject to any disclaimer, the term of this patent is extended or adjusted under 35 U.S.C. 154(b) by 216 days.

(21) Appl. No.: 16/887,812

(22) Filed: May 29, 2020

(65) Prior Publication Data

US 2021/0372825 A1 Dec. 2, 2021

(51) Int. Cl.
*G01D 5/24* (2006.01)
*H03F 3/387* (2006.01)

(52) U.S. Cl.
CPC .............. *G01D 5/24* (2013.01); *H03F 3/387* (2013.01)

(58) Field of Classification Search
CPC .................................. H03F 3/387; G01D 5/24
See application file for complete search history.

(56) References Cited

U.S. PATENT DOCUMENTS

| | | | |
|---|---|---|---|
| 4,843,339 A * | 6/1989 | Burt | C08F 220/04 330/10 |
| 5,392,218 A * | 2/1995 | Emmerich | G01D 9/005 702/66 |
| 6,351,530 B1 | 2/2002 | Rahamim et al. | |
| 7,110,531 B2 | 9/2006 | Prendergast et al. | |
| 7,113,750 B2 | 9/2006 | Eastwood | |
| 8,004,863 B2 | 8/2011 | Schopfer et al. | |
| 8,928,383 B2 | 1/2015 | Goswami et al. | |
| 9,184,588 B2 | 11/2015 | Mueck | |
| 9,531,280 B2 | 12/2016 | Peng et al. | |
| 9,584,147 B2 | 2/2017 | Glibbery et al. | |
| 9,948,175 B2 | 4/2018 | Zhao et al. | |
| 10,003,267 B1 | 6/2018 | Zhao et al. | |

(Continued)

FOREIGN PATENT DOCUMENTS

| | | |
|---|---|---|
| EP | 1 280 277 A2 | 1/2003 |
| JP | 2003-309526 A | 10/2003 |
| JP | 2004-120563 A | 4/2004 |
| JP | 4033701 B2 | 1/2008 |

(Continued)

OTHER PUBLICATIONS

International Search Report and Written Opinion dated Sep. 21, 2021 for International Application No. PCT/IB2021/000355.

(Continued)

*Primary Examiner* — Patricia T Nguyen
(74) *Attorney, Agent, or Firm* — Wolf, Greenfield & Sacks, P.C.

(57) ABSTRACT

Isolated circuit systems are provided. The systems include a primary side circuit and a secondary circuit, electrically isolated from each other. The primary side and secondary side circuits each utilize a direct current (DC) reference signal. The primary side circuit may use the DC reference signal in a modulation operation. The secondary side circuit may use the DC reference signal in a demodulation operation. The DC reference signal may be sent from the primary side circuit to the secondary side circuit, or from the secondary side circuit to the primary side circuit.

26 Claims, 7 Drawing Sheets

(56) References Cited

U.S. PATENT DOCUMENTS

| | | | |
|---|---|---|---|
| 10,164,614 B2 | 12/2018 | Yang et al. | |
| 10,536,309 B2* | 1/2020 | Yun | H03K 5/2481 |
| 10,680,526 B2 | 6/2020 | Zhuo et al. | |
| 2012/0099345 A1 | 4/2012 | Zhao et al. | |
| 2015/0263673 A1* | 9/2015 | Biel | A61B 5/369 |
| | | | 600/372 |
| 2017/0026166 A1 | 1/2017 | Barrenscheen | |
| 2017/0288650 A1 | 10/2017 | Yang et al. | |
| 2018/0041130 A1 | 2/2018 | Kunz et al. | |
| 2018/0062678 A1 | 3/2018 | Ragonese et al. | |
| 2018/0175735 A1 | 6/2018 | Zhao et al. | |
| 2018/0205319 A1 | 7/2018 | Zhuo et al. | |
| 2018/0323759 A1 | 11/2018 | Cojocaru et al. | |
| 2020/0036284 A1 | 1/2020 | Qin et al. | |
| 2020/0083874 A1 | 3/2020 | Zhuo et al. | |
| 2022/0085782 A1* | 3/2022 | Imai | H03G 3/3089 |

FOREIGN PATENT DOCUMENTS

| | | |
|---|---|---|
| JP | 2019-039904 A | 3/2019 |
| WO | WO 02/25914 A1 | 3/2002 |
| WO | WO 2002/025914 A1 | 3/2002 |

OTHER PUBLICATIONS

Culurciello et al., 3D Integrated sensors in Silicon-on-Sapphire CMOS. IEEE International Symposium on Circuits and Systems. May 21, 2006, pp. 4959-4962.

Scharrer et al., Efficient Bi-Directional Digital Communication Scheme for Isolated Switch Mode Power Converters. IEEE Transactions on Circuits and Systems I: Regular Papers. Dec. 2012. vol. 59, No. 12, pp. 3081-3089.

PCT/IB2021/000355, filed Sep. 21, 2021, International Search Report and Written Opinion.

\* cited by examiner

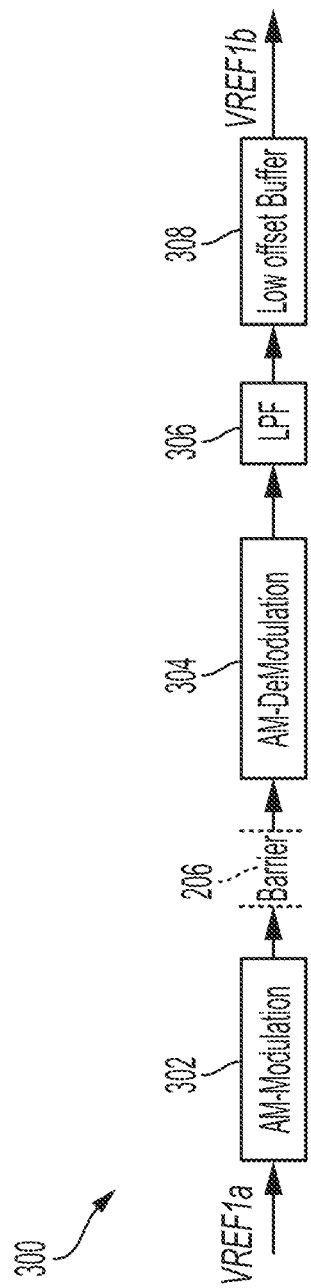

ISOLATION AMPLIFIER WITH REFERENCE SIGNAL TRANSFER

FIELD OF THE DISCLOSURE

The present application relates to galvanic isolators providing galvanic isolation between circuits.

BACKGROUND

Isolators provide electrical isolation between circuits which communicate with each other. In some situations, circuits which communicate with each other operate at different voltages, for instance one at a relatively high voltage and the other at a relatively low voltage. In some situations, the circuits are referenced to different electrical ground potentials. Isolators can be used to electrically isolate circuits in either of these situations.

BRIEF SUMMARY

Isolated circuit systems are provided. The systems include a primary side circuit and a secondary circuit, electrically isolated from each other. The primary side and secondary side circuits each utilize a direct current (DC) reference signal. The primary side circuit may use the DC reference signal in a modulation operation. The secondary side circuit may use the DC reference signal in a demodulation operation. The DC reference signal may be sent from the primary side circuit to the secondary side circuit, or from the secondary side circuit to the primary side circuit.

According to some embodiments, an isolation amplifier is provided, comprising: a primary side circuit having at least one component configured to operate from a direct current (DC) reference signal; a secondary side circuit having at least one component configured to operate from the DC reference signal; an isolation barrier separating the primary and secondary side circuits; a first digital data path configured to transfer digital data between the primary and secondary side circuits across the isolation barrier; and a reference signal path configured to transfer the DC reference signal between the primary and secondary side circuits across the isolation barrier.

According to some embodiments, a multi-die isolator system is provided, comprising: a first die having a primary circuit with an encoder configured to employ a bandgap reference signal to encode a data signal; a second die having a secondary circuit with a decoder configured to employ the bandgap reference signal to decode the data signal; an isolator configured to isolate the primary circuit and the secondary circuit from each other; and a reference signal path coupling the first die and second die and configured to communicate the bandgap reference signal between the primary and secondary circuits.

According to some embodiments, a method of operating an isolated circuit system having a primary circuit on a first die and a secondary circuit on a second die, the method comprising: modulating a data signal with the primary circuit using a direct current (DC) reference signal; transferring the data signal from the primary circuit to the secondary circuit across an isolation barrier; demodulating the data signal with the secondary circuit using the DC reference signal; and communicating the DC reference signal between the primary and secondary circuits.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3 illustrates a capacitive isolated signal transfer for transferring a reference signal, according to a non-limiting embodiment of the present application.

DETAILED DESCRIPTION

According to an aspect of the present application, an isolation amplifier is configured to transfer a reference signal from a primary to a secondary side or vice versa. The isolation amplifier may be used to transfer a digital data signal, power signal, or both between the isolated domains. The reference signal is a signal used in the modulation and demodulation of the digital data signal or power signal, and is distinct from the data signal or power signal. The reference signal may be a direct current (DC) signal.

According to an aspect of the present application, an isolation amplifier includes (at least) two isolation signal paths; a first (digital) data isolation path and a second analog reference signal isolation path. The reference signal may be used in processing a digital signal sent over the digital data isolation path. For example, the reference signal may be a reference signal for encoding or decoding circuitry.

According to an aspect of the present application, an isolation amplifier is provided comprising a transmission path from a primary side to a secondary side for a reference signal. In some embodiments, the transfer path is capacitive. In some embodiments, the transfer path is transformer based.

Figure 1:
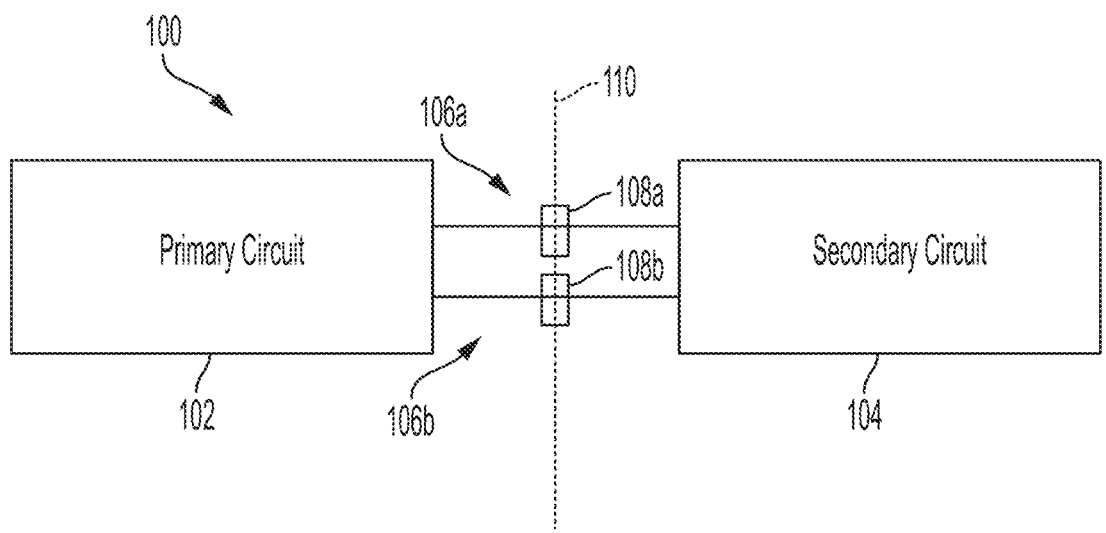
FIG. 1 illustrates an isolator system having a signal path for transferring a reference signal between primary and secondary side circuits of the isolator system.

FIG. 1 illustrates an isolator system having a signal path for transferring a reference signal between primary and secondary side circuits of the isolator system. The isolator system 100 comprises a primary circuit 102, secondary circuit 104, first signal path 106a, second signal path 106b, first isolation component 108a, and second isolation component 108b. The isolation components 108a and 108b allow for signal transfer across an isolation barrier 110.

The primary circuit 102 may include transmitter and/or receiver electronics. In some embodiments, the primary circuit 102 is an integrated circuit formed on a semiconductor die or chip. The secondary circuit 104 likewise may include transmitter and/or receiver electronics. In some embodiments, the secondary circuit 104 is an integrated circuit formed on a semiconductor die. Thus, in some embodiments, the isolator system 100 comprises a primary side integrated circuit on a first chip, a secondary side integrated circuit on a second chip, and an isolation barrier 110 electrically isolating the primary side integrated circuit the secondary side integrated circuit. The isolation barrier may be a dielectric layer.

The first signal path 106a and second signal path 106b may be configured to transfer different types of signals, with one being a reference signal. For example, first signal path 106a may carry an analog reference signal between the primary circuit 102 and secondary circuit 104. The reference signal may be used as a reference by circuitry both in the primary circuit 102 and the secondary circuit 104. The second signal path 106b may carry a digital data signal, a power signal, or both. The first signal path 106a comprises isolation component 108a, which may be a transformer, capacitor, or other type of isolator. The second signal path 106b comprises isolation component 108b, which may be a transformer, capacitor, or other type of isolator. The isolation components 108a and 108b may be the same type of isolation component, such as bother being capacitors or transformers, although not all embodiments are limited in this respect.

Figure 2A:
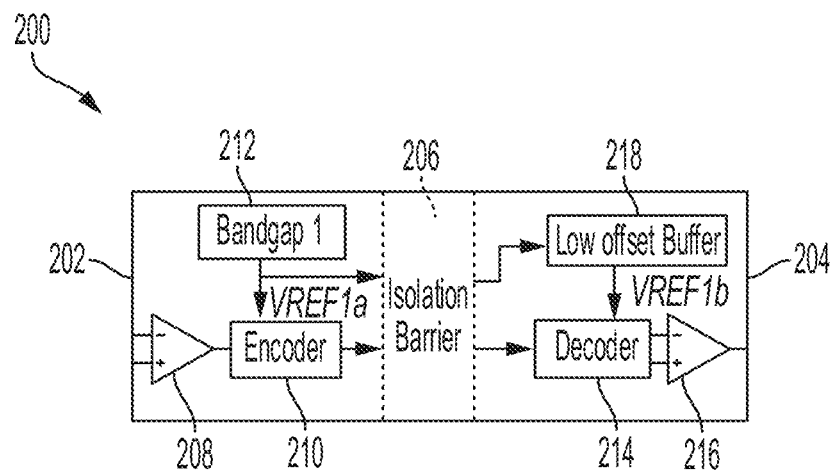
FIG. 2A illustrates an isolator system comprising a signal path for transferring a reference signal from a primary side circuit to a secondary side circuit of the isolator system, according to a non-limiting embodiment.

FIG. 2A illustrates an isolator system comprising a signal path for transferring a reference signal from a primary side circuit to a secondary side circuit of the isolator system, according to a non-limiting embodiment. Thus, FIG. 2A illustrates on non-limiting implementation of the isolator system 100. The isolator system 200 comprises a primary side circuit 202 and secondary side circuit 204 separated by an isolation barrier 206. The primary side circuit 202 includes a driver 208, encoder 210, and bandgap signal generator 212. The secondary side circuit 204 comprises a decoder 214, amplifier 216, and low offset buffer 218.

Figure 2B:
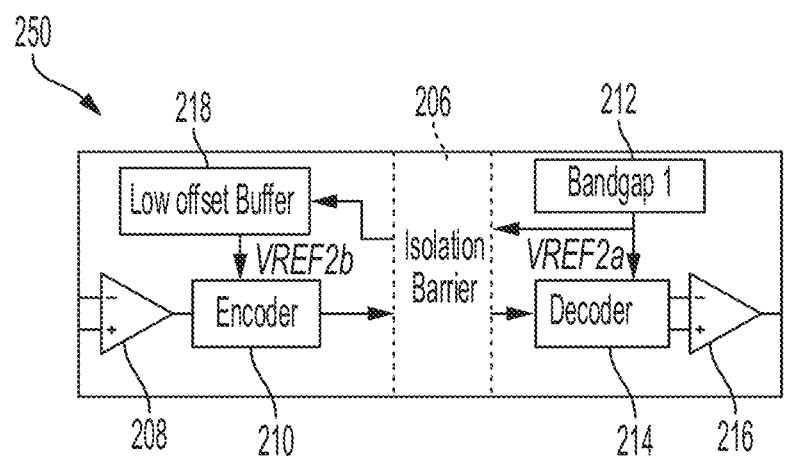
FIG. 2B illustrates an isolator system comprising a signal path for transferring a reference signal from a secondary side circuit to a primary side circuit of the isolator system, according to a non-limiting embodiment.

FIG. 2B illustrates an isolator system comprising a signal path for transferring a reference signal from a secondary side circuit to a primary side circuit of the isolator system, according to a non-limiting embodiment. The isolator system 250 of FIG. 2B includes the same components as the isolator system 200 of FIG. 1. However, the bandgap generator 212 and low offset buffer 218 have switched sides of the isolator system. Thus, the reference signal may be sent from the secondary side circuit to the primary side circuit.

From FIGS. 2A and 2B, it should be appreciated that an embodiment of the present application provides a primary side circuit having at least one component configured to operate from a direct current (DC) reference signal, and a secondary side circuit having at least one component configured to operate from the DC reference signal. In some embodiments, a first integrated circuit die comprises the primary side circuit and a second integrated circuit die comprises the secondary side circuit. According to an embodiment, the at least one component of the primary side circuit is an analog-to-digital converter (ADC), and the at least one component of the secondary side circuit is a digital-to-analog converter (DAC). According to an embodiment, the at least one component of the primary side circuit is an encoder and the at least one component of the secondary side circuit is a decoder.

Moreover, it should be appreciated from FIGS. 2A and 2B, that a multi-die isolator system may be provided, comprising a first die having a primary circuit with an encoder configured to employ a bandgap reference signal to encode a data signal, and a second die having a secondary circuit with a decoder configured to employ the bandgap reference signal to decode the data signal. An isolator may be configured to isolate the primary circuit and the secondary circuit from each other, and a reference signal path may be provided coupling the first die and second die and configured to communicate the bandgap reference signal between the primary and secondary circuits.

FIG. 3 illustrates an isolated signal path for transferring a reference signal, according to a non-limiting embodiment of the present application. As shown in FIG. 2A the reference signal may be transferred from the primary side circuit to the secondary side circuit. This may be accomplished using the circuit blocks shown in FIG. 3. The isolated signal path 300 comprises an amplitude modulation (AM) block 302 which receives the reference signal (VREF1a) and modulates its amplitude. The reference signal VREF1a provided to the AM modulation block 302 may be an AC signal generated from the DC reference signal used in the primary side circuit. Thus, the reference signal path is configured to convert the DC reference signal to an AC value prior to the DC reference signal being transferred across the isolation barrier. The AM modulated reference signal may be transferred across the isolation barrier 206 using a suitable technique, such as capacitive or inductive coupling. Examples are shown below in connection with FIGS. 4 and 5. On the secondary side of the isolator, the received reference signal may be demodulated using an amplitude demodulation block 304. The output of the amplitude demodulation block 304 may be filtered with a low pass filter 306. The use of a low pass filter 306 is appropriate since the reference signal is a DC signal. Next, the low pass filtered reference signal may be provided to a low offset buffer 308. The low offset buffer 308 outputs the transferred reference signal, VREF1b, for example to circuitry on the secondary side circuit which uses the reference signal as a reference. For example, the low offset buffer 308 may output the transferred reference signal to a decoder, as shown in FIG. 2A. Optionally, the low offset buffer 308 may provide gain calibration.

Figure 4:
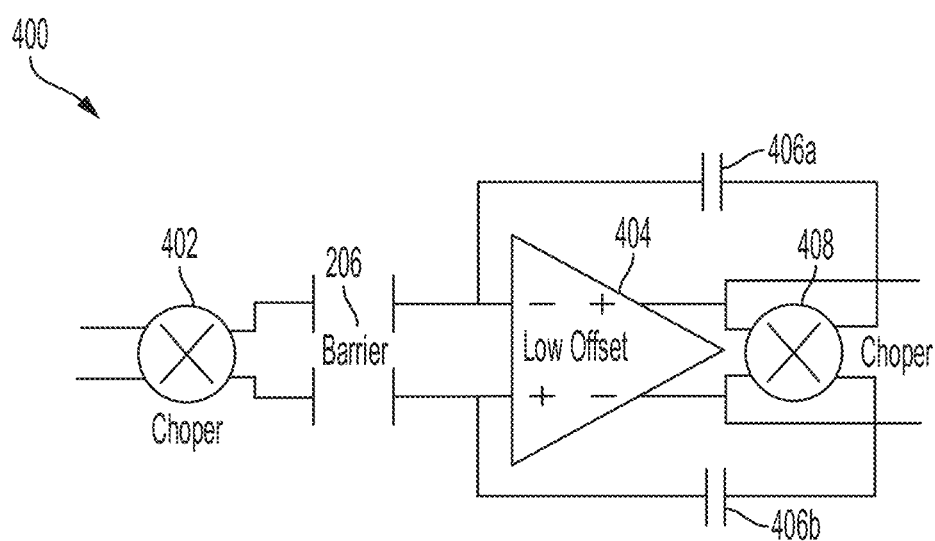
FIG. 4 illustrates a capacitor-based isolated signal transfer path for transferring a reference signal, according to a non-limiting embodiment of the present application.

FIG. 4 illustrates a non-limiting example of a circuit implementation of the isolated signal path 300 of FIG. 3, comprising a capacitive signal transfer path for transferring a reference signal. Thus, it should be appreciated that the circuitry of FIG. 4 represents a non-limiting example of circuitry which may be implemented in an isolator system such as that of FIG. 2A. As shown, the isolated signal path 400 comprises a signal chopper 402 on the primary side of isolation barrier 206, a low offset buffer 404, capacitors 406a and 406b, and a signal chopper 408.

The signal choppers 402 and 408 may be any suitable signal choppers. The signal chopper 402 may perform amplitude modulation of a reference signal to be transferred across the isolation barrier 206. Signal chopper 408 may perform amplitude demodulation of the transferred reference signal. Thus, signal chopper 402 represents an implementation of amplitude modulation block 302, and signal chopper 408 represents an implementation of amplitude demodulation block 304.

As shown, both signal choppers are differential. Use of differential signal choppers facilitates differential signaling across the isolation barrier 206, which may be beneficial for robust signal transfer, avoiding the noise and offset drawbacks associated with single-ended signaling. The reference signal may be input to the signal chopper 402 as a differential alternating current signal.

The capacitors 406a and 406b may be configured to provide low pass filtering. Thus, those capacitors represent a non-limiting implementation of the low pass filter 306.

They may have any suitable values for providing the desired low pass filtering performance.

The low offset buffer 404 is shown as a differential buffer, consistent with the differential signaling scheme of isolated signal path 400. The low offset buffer 404 is a non-limiting implementation of the low offset buffer 308 of FIG. 3. The low offset buffer 404 outputs the reference signal, consistent with low offset buffer 308 of FIG. 3.

Figure 5:
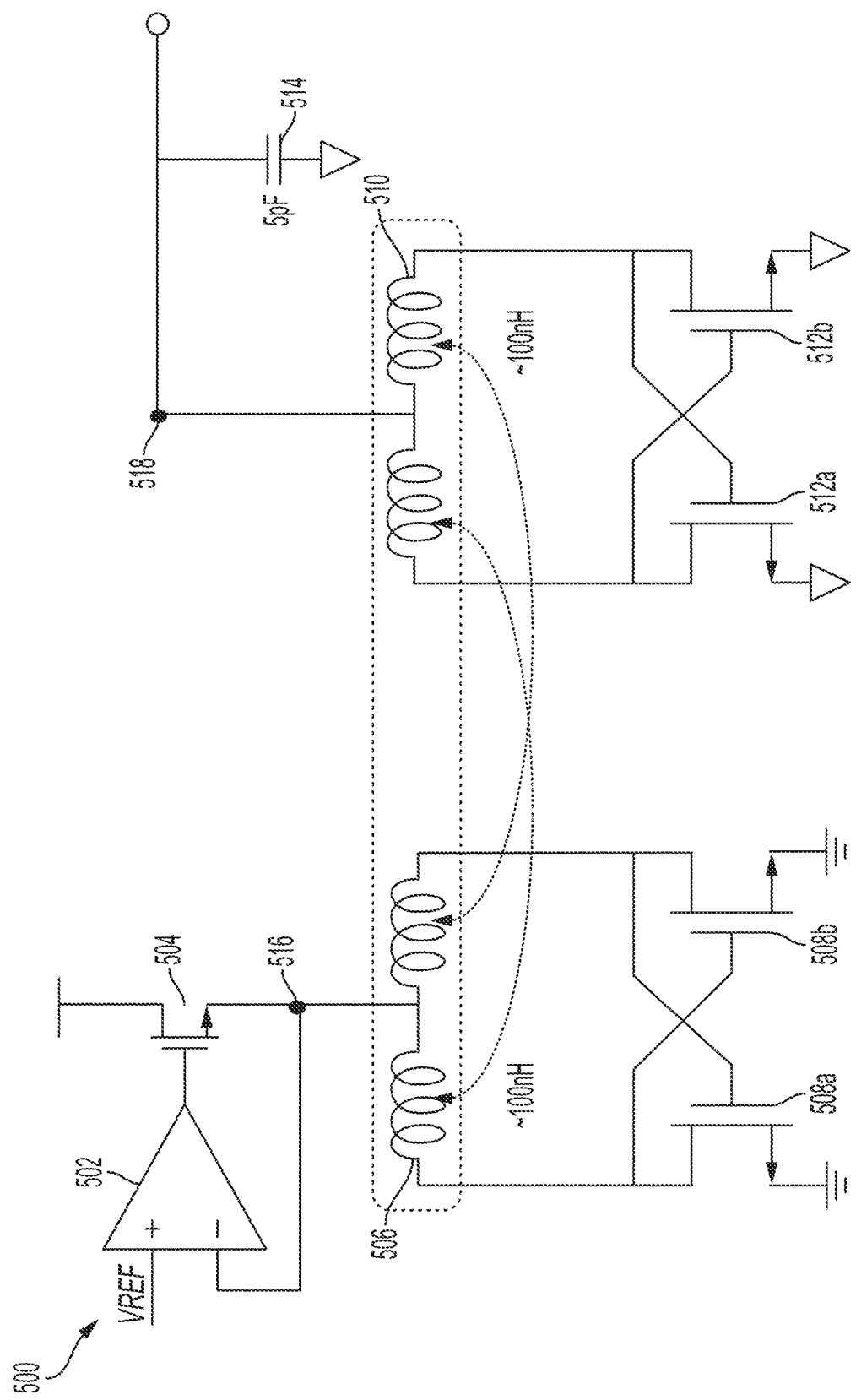
FIG. 5 illustrates a transformer-based isolated signal transfer path for transferring a reference signal, according to a non-limiting embodiment of the present application.

FIG. 5 illustrates another non-limiting example of a circuit implementation of the isolated signal path 300 of FIG. 3, comprising a transformer-based isolated signal transfer path for transferring a reference signal. The isolated signal path 500 comprises a driver 502, switch 504, primary coil 506, and cross-coupled switches 508a and 508b. On the secondary side of the isolated signal path is a secondary coil 510, cross-coupled switches 512a and 512b, and a capacitor 514.

The driver 502 receives the reference signal VREF on its positive terminal, and outputs a signal controlling the switch 504. The cross-coupled switches 508a and 508b cause oscillation, which allows primary coil 506 to transmit an AC signal to secondary coil 510. Cross-coupled switches 512a and 512b operate to demodulate the signal, and the capacitor 514 works as a low pass filter. Thus, the reference signal at nodes 516 and 518 is substantially equal, and in this manner the DC reference signal may be transferred over an isolated signal path.

Figure 6:
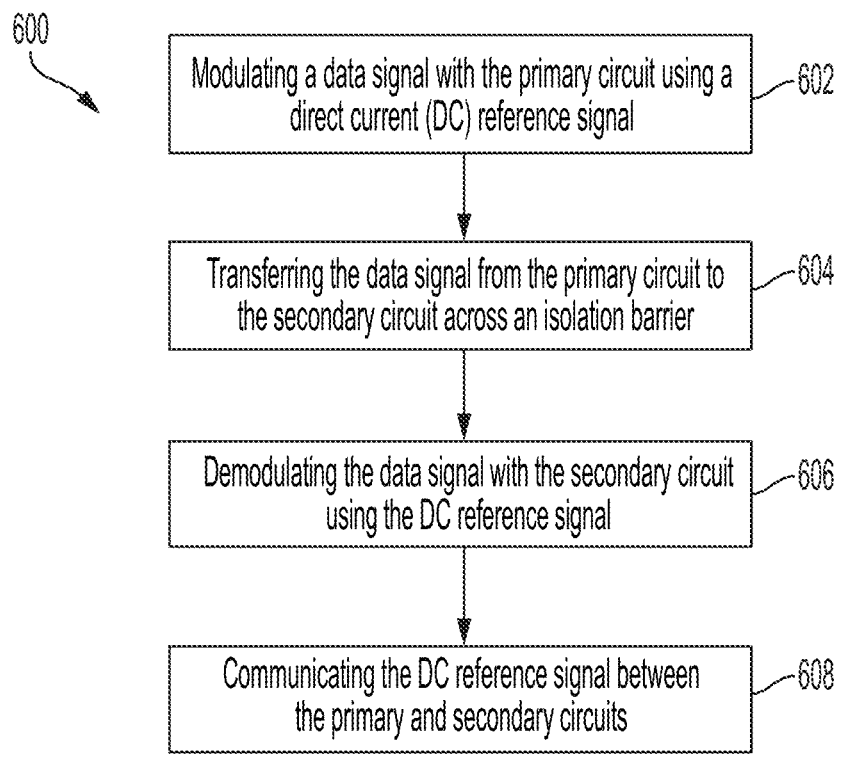
FIG. 6 is a flowchart illustrating a manner of operating an isolator system, according to a non-limiting embodiment of the present application.

FIG. 6 is a flowchart illustrating a manner of operating an isolator system, according to a non-limiting embodiment of the present application. The method 500 begins at stage 502, with modulating a data signal with a primary circuit using a direct current (DC) reference signal. The direct current reference signal may be an analog signal.

At stage 604, the method 600 comprises transferring the data signal from the primary circuit to the secondary circuit across an isolation barrier. The data signal may be a digital data signal.

At stage 606, the method 600 comprises communicating the DC reference signal between the primary and secondary circuits.

At stage 608, the method comprises demodulating the data signal with the secondary circuit using the DC reference signal from stage 602.

Figure 7:
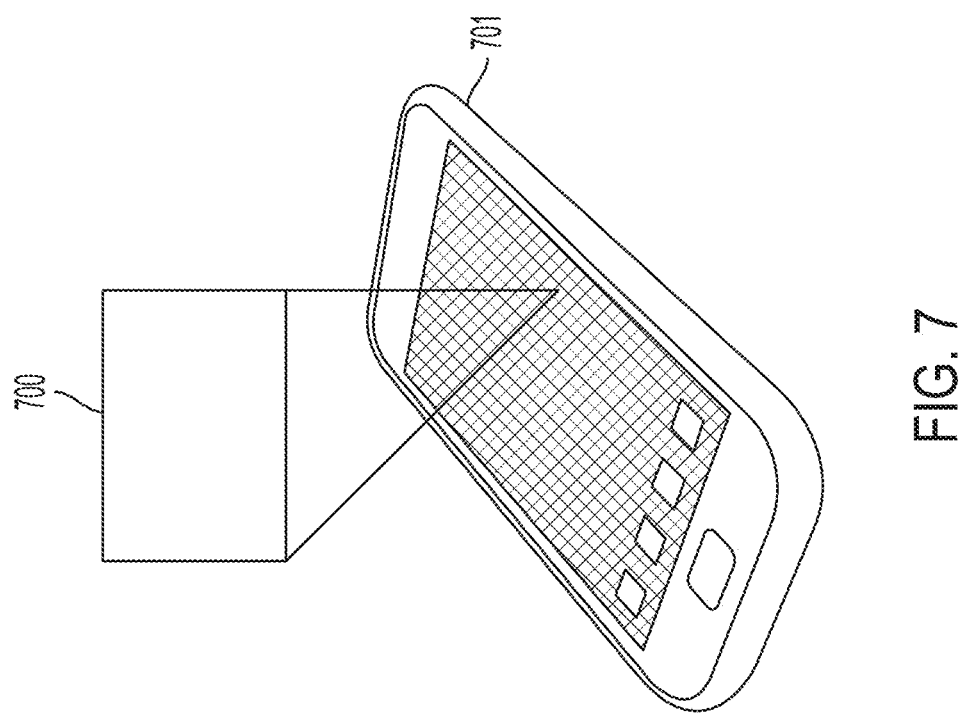
FIG. 7 is a schematic diagram illustrating a portable electronic device incorporating an integrated isolator device, according to some embodiments.

FIG. 7 illustrates an apparatus which may employ an isolator system according to aspects of the present application.

Integrated isolator devices of the types described herein may be used in various devices and settings. For example, the integrated isolator devices may be used for isolation in medical equipment systems, industrial equipment systems, physical measurement systems, or personal or portable electronic equipment. FIG. 7 is a schematic diagram showing a non-limiting application of an integrated isolator system in a portable electronic device setting, according to some embodiments. An integrated isolator system 700 may be used in a portable electronic device 701 to transmit power or data across an isolation barrier. The portable electronic device 701 may be a smartphone, personal digital assistant (PDA), tablet or other portable device. Other such devices may make use of integrated isolator systems of the types described herein.

While FIG. 7 illustrates an example of a portable electronic device 701 incorporating aspects of the present application, other uses are possible. For example, one or more integrated isolator systems 700 may be employed in an automobile or a medical instrument. Various embodiments of the present application may be implemented to provide high transfer efficiency and high isolation rating at high operating frequencies.

The integrated isolator devices described herein may be used in various applications (e.g., industrial, medical, consumer). For example, data transfer and/or power transfer between galvanically isolated systems may be accomplished with the integrated isolator devices described herein. As one example, medical equipment in a room in which a medical procedure is being performed may be galvanically isolated from a control system in a control room. For instance, a piece of medical imaging equipment and/or monitors in the room in which the procedure is being performed may be isolated from a system controlling operation of the imaging equipment and/or display. The isolator may be an integrated isolator device and/or system of any of the types described herein, and the isolated signal path may be analog or digital.

As another example, industrial equipment may be isolated from a control system controlling the equipment. For example, high wattage motors may be isolated from control systems controlling their operation by integrated isolator device of the types described herein. The control systems may operate at a lower wattage than the high wattage motors used by the industrial equipment. The isolator may be disposed on a circuit board on which various circuit components connected to the motors and/or control equipment are included.

Other uses of the integrated isolator devices described herein are also possible, as those examples described are non-limiting.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An isolation amplifier, comprising:
   a primary side circuit having at least one component configured to operate from a direct current (DC) reference signal;
   a secondary side circuit having at least one component configured to operate from the DC reference signal;
   an isolation barrier separating the primary and secondary side circuits;
   a first digital data path configured to transfer digital data between the primary and secondary side circuits across the isolation barrier; and
   a reference signal path configured to transfer the DC reference signal between the primary and secondary side circuits across the isolation barrier,
   wherein the reference signal path is configured to convert the DC reference signal to an AC value prior to the DC reference signal being transferred across the isolation barrier.

2. An isolation amplifier, comprising:
   a primary side circuit having at least one component configured to operate from a direct current (DC) reference signal;
   a secondary side circuit having at least one component configured to operate from the DC reference signal;
   an isolation barrier separating the primary and secondary side circuits;
   a first digital data path configured to transfer digital data between the primary and secondary side circuits across the isolation barrier; and a reference signal path configured to transfer the DC reference signal between the primary and secondary side circuits across the isolation barrier, wherein the reference signal path is configured to transfer the DC reference signal across the isolation barrier capacitively.

3. An isolation amplifier, comprising:

a primary side circuit having at least one component configured to operate from a direct current (DC) reference signal;

a secondary side circuit having at least one component configured to operate from the DC reference signal;

an isolation barrier separating the primary and secondary side circuits;

a first digital data path configured to transfer digital data between the primary and secondary side circuits across the isolation barrier; and a reference signal path configured to transfer the DC reference signal between the primary and secondary side circuits across the isolation barrier, wherein the reference signal path is configured to transfer the DC reference signal across the isolation barrier inductively.

4. An isolation amplifier, comprising:

a primary side circuit having at least one component configured to operate from a direct current (DC) reference signal;

a secondary side circuit having at least one component configured to operate from the DC reference signal;

an isolation barrier separating the primary and secondary side circuits;

a first digital data path configured to transfer digital data between the primary and secondary side circuits across the isolation barrier; and a reference signal path configured to transfer the DC reference signal between the primary and secondary side circuits across the isolation barrier, further comprising a first integrated circuit die comprising the primary side circuit and a second integrated circuit die comprising the secondary side circuit.

5. An isolation amplifier, comprising:

a primary side circuit having at least one component configured to operate from a direct current (DC) reference signal;

a secondary side circuit having at least one component configured to operate from the DC reference signal;

an isolation barrier separating the primary and secondary side circuits;

a first digital data path configured to transfer digital data between the primary and secondary side circuits across the isolation barrier; and a reference signal path configured to transfer the DC reference signal between the primary and secondary side circuits across the isolation barrier, wherein the at least one component of the primary side circuit is an analog-to-digital converter (ADC).

6. The isolation amplifier of claim 5, wherein the at least one component of the secondary side circuit is a digital-to-analog converter (DAC).

7. An isolation amplifier, comprising:

a primary side circuit having at least one component configured to operate from a direct current (DC) reference signal;

a secondary side circuit having at least one component configured to operate from the DC reference signal;

an isolation barrier separating the primary and secondary side circuits;

a first digital data path configured to transfer digital data between the primary and secondary side circuits across the isolation barrier; and a reference signal path configured to transfer the DC reference signal between the primary and secondary side circuits across the isolation barrier, wherein the at least one component of the primary side circuit is an encoder and the at least one component of the secondary side circuit is a decoder.

8. The isolation amplifier of claim 7, wherein the reference signal path comprises an amplitude modulation circuit configured to encode the DC reference signal as an amplitude modulated analog signal.

9. A multi-die isolator system, comprising:

a first die having a primary circuit with an encoder configured to employ a bandgap reference signal to encode a data signal;

a second die having a secondary circuit with a decoder configured to employ the bandgap reference signal to decode the data signal;

an isolator configured to isolate the primary circuit and the secondary circuit from each other; and a reference signal path coupling the first die and second die and configured to communicate the bandgap reference signal between the primary and secondary circuits, wherein the bandgap reference signal is a direct current (DC) signal, and wherein the reference signal path is configured to amplitude modulate the bandgap reference signal to communicate the bandgap reference signal between the primary and secondary circuits.

10. A multi-die isolator system, comprising:

a first die having a primary circuit with an encoder configured to employ a bandgap reference signal to encode a data signal;

a second die having a secondary circuit with a decoder configured to employ the bandgap reference signal to decode the data signal;

an isolator configured to isolate the primary circuit and the secondary circuit from each other; and a reference signal path coupling the first die and second die and configured to communicate the bandgap reference signal between the primary and secondary circuits, wherein the encoder is an analog-to-digital converter (ADC) and the decoder is a digital-to-analog converter (DAC).

11. A multi-die isolator system, comprising:

a first die having a primary circuit with an encoder configured to employ a bandgap reference signal to encode a data signal;

a second die having a secondary circuit with a decoder configured to employ the bandgap reference signal to decode the data signal;

an isolator configured to isolate the primary circuit and the secondary circuit from each other; and a reference signal path coupling the first die and second die and configured to communicate the bandgap reference signal between the primary and secondary circuits, wherein the reference signal path is configured to communicate the bandgap reference signal from the primary circuit to the secondary circuit.

12. The multi-die isolator system of claim 11, wherein the reference signal path is configured to communicate the bandgap reference signal from the secondary circuit to the primary circuit.

13. A multi-die isolator system, comprising:
a first die having a primary circuit with an encoder configured to employ a bandgap reference signal to encode a data signal;
a second die having a secondary circuit with a decoder configured to employ the bandgap reference signal to decode the data signal;
an isolator configured to isolate the primary circuit and the secondary circuit from each other; and
a reference signal path coupling the first die and second die and configured to communicate the bandgap reference signal between the primary and secondary circuits,
wherein the reference signal path comprises a capacitive coupler.

14. A method of operating an isolated circuit system having a primary circuit on a first die and a secondary circuit on a second die, the method comprising:
modulating a data signal with the primary circuit using a direct current (DC) reference signal;
transferring the data signal from the primary circuit to the secondary circuit across an isolation barrier;
demodulating the data signal with the secondary circuit using the DC reference signal; and
communicating the DC reference signal between the primary and secondary circuits.

15. The method of claim 14, wherein communicating the DC reference signal between the primary and secondary circuits comprises transferring the DC reference signal from the primary circuit to the secondary circuit.

16. The method of claim 14, wherein communicating the DC reference signal between the primary and secondary circuits comprises transferring the DC reference signal from the secondary circuit to the primary circuit.

17. The method of claim 14, wherein communicating the DC reference signal between the primary and secondary circuits comprises amplitude modulating the DC reference signal.

18. The method of claim 14, wherein communicating the DC reference signal between the primary and secondary circuits comprises capacitively coupling the DC reference signal between the primary and secondary circuits.

19. The isolation amplifier of claim 2, wherein the reference signal path is configured to convert the DC reference signal to an AC value prior to the DC reference signal being transferred across the isolation barrier.

20. The isolation amplifier of claim 3, wherein the reference signal path is configured to convert the DC reference signal to an AC value prior to the DC reference signal being transferred across the isolation barrier.

21. The isolation amplifier of claim 4, wherein the reference signal path is configured to convert the DC reference signal to an AC value prior to the DC reference signal being transferred across the isolation barrier.

22. The isolation amplifier of claim 5, wherein the reference signal path is configured to convert the DC reference signal to an AC value prior to the DC reference signal being transferred across the isolation barrier.

23. The isolation amplifier of claim 7, wherein the reference signal path is configured to convert the DC reference signal to an AC value prior to the DC reference signal being transferred across the isolation barrier.

24. The multi-die isolator system of claim 10, wherein the bandgap reference signal is a direct current (DC) signal, and wherein the reference signal path is configured to amplitude modulate the bandgap reference signal to communicate the bandgap reference signal between the primary and secondary circuits.

25. The multi-die isolator system of claim 11, wherein the bandgap reference signal is a direct current (DC) signal, and wherein the reference signal path is configured to amplitude modulate the bandgap reference signal to communicate the bandgap reference signal between the primary and secondary circuits.

26. The multi-die isolator system of claim 13, wherein the bandgap reference signal is a direct current (DC) signal, and wherein the reference signal path is configured to amplitude modulate the bandgap reference signal to communicate the bandgap reference signal between the primary and secondary circuits.

* * * * *